US008250746B2

(12) United States Patent
Zhou

(10) Patent No.: US 8,250,746 B2
(45) Date of Patent: Aug. 28, 2012

(54) METHOD FOR MAKING ELECTRONIC DEVICE HAVING METALLIC CONNECTING STRUCTURE

(75) Inventor: Jin-Gang Zhou, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 1119 days.

(21) Appl. No.: 12/156,817

(22) Filed: Jun. 5, 2008

(65) Prior Publication Data

US 2008/0295316 A1 Dec. 4, 2008

Related U.S. Application Data

(62) Division of application No. 11/843,668, filed on Aug. 23, 2007, now abandoned.

(30) Foreign Application Priority Data

May 30, 2007 (CN) .......................... 2007 1 0200720

(51) Int. Cl.
*H05K 3/30* (2006.01)

(52) U.S. Cl. ............................... 29/832; 29/825; 29/840

(58) Field of Classification Search .................... 29/825, 29/832, 840

See application file for complete search history.

(56) References Cited

U.S. PATENT DOCUMENTS

| | | | | |
|---|---|---|---|---|
| 5,756,185 | A | 5/1998 | Lesser | |
| 6,409,859 | B1 * | 6/2002 | Chung | 156/69 |
| 6,538,197 | B1 | 3/2003 | Kawai | |
| 7,473,995 | B2 * | 1/2009 | Rumer et al. | 257/707 |

FOREIGN PATENT DOCUMENTS

| | | |
|---|---|---|
| TW | 555109 | 9/2003 |

* cited by examiner

*Primary Examiner* — Carl Arbes

(74) *Attorney, Agent, or Firm* — Altis Law Group, Inc.

(57) ABSTRACT

An exemplary method for making an electronic device includes: providing a hot press machine having a press head; placing a bonding film on an inner surface of a metallic housing; turning on the hot press machine and heating the press head to a first predetermined temperature; after heated to the first predetermined temperature, driving the press head to press the bonding film to the metallic housing for about two minutes, thereby attaching the bonding film on the metallic housing; placing the metallic element according to the corresponding bonding film of the metallic housing; heating the press head to a second predetermined temperature; and after heated to the second predetermined temperature, driving the press head to press the at least one metallic element to the metallic housing for at least two minutes, thereby attaching the at least one metallic element on the corresponding bonding film.

9 Claims, 4 Drawing Sheets

METHOD FOR MAKING ELECTRONIC DEVICE HAVING METALLIC CONNECTING STRUCTURE

CROSS-REFERENCE TO RELATED APPLICATION

This application is a divisional application of Ser. No. 11/843,668, filed on Aug. 23, 2007 now abandoned, entitled "ELECTRON DEVICE HAVING METALLIC CONNECTING STRUCTURE AND METHOD FOR MAKING THE SAME".

TECHNICAL FIELD

The present invention relates to a method for making electronic devices having a metallic connecting structure.

BACKGROUND

With the development of wireless communication and information processing technologies, portable electronic devices, such as notebook computers, mobile phones and personal digital assistants (PDAs), are now in widespread use. In order to provide the electronic devices with a high mechanical strength and an attractive appearance, the electronic device makers usually employ a housing made with metal materials, such as stainless steel, magnesium-aluminum alloy, and so on.

Typically, the metallic housing of the electronic device is manufactured by punching a raw metal sheet. A number of clasping or latching structures are usually defined at an inner surface of the metallic housing. The clasping or latching structures are configured for attaching or holding inner electronic components in the electronic device or for connecting to other parts of the metallic housing. For example, a metallic clip is fixed to the inner surface of the metallic housing such that the metallic clip can be assembled to act as a restraint that presses down on some of the electronic components in the electronic device to keep them in place. A number of studs are formed on the inner surface of the metallic housing such that some of the electronic components can be fixed onto the metallic housing via screws engaged with the studs.

Generally, because the clasping or latching structures of the metallic housing are complicated, it is difficult to manufacture the metallic housing with such clasping or latching structures by punching. Nowadays, the metallic clips and metallic studs are welded onto the inner surface of the metallic housing by laser. However, an outer surface of the metallic housing may deform or change color due to the high temperature of the laser welding. Accordingly, the electronic device having the metallic housing may lose its attractive appearance.

What is needed, therefore, is an electronic device having metallic connecting structures that overcomes the above mentioned disadvantages. Methods for making the electronic device are also desired.

SUMMARY

A method for making an electronic device having a metallic housing, at least one bonding film and at least one metallic element, the at least one metallic element fixed to an inner surface of the metallic housing via the bonding film. The method includes: providing a hot press machine having a press head; placing the one bonding film on the inner surface of the metallic housing; turning on the hot press machine and heating the press head to a first predetermined temperature of about 40° C. to about 50° C.; after heating the press head to the first predetermined temperature, driving the press head to press the bonding film to the metallic housing for a first predetermined time, thereby attaching the bonding film on the metallic housing; placing the metallic element according to the corresponding bonding film of the metallic housing; heating the press head to a second predetermined temperature of about 160° C. to about 170° C.; and after heating the press head to the second predetermined temperature, driving the press head to press the at least one metallic element to the metallic housing for second predetermined time, thereby attaching the at least one metallic element on the corresponding bonding film.

Other advantages and novel features will become more apparent from the following detailed description of preferred embodiments, when taken in conjunction with the accompanying drawings.

BRIEF DESCRIPTION OF THE DRAWINGS

The components in the drawings are not necessarily drawn to scale, the emphasis instead being placed upon clearly illustrating the principles of the present method for making an electronic device having a metallic connecting structure. Moreover, in the drawings, like reference numerals designate corresponding parts throughout the several views, and all the views are schematic.

DETAILED DESCRIPTION OF THE PREFERRED EMBODIMENTS

Reference will now be made to the drawings to describe the preferred embodiments of the present electronic device having a metallic connecting structure and the methods for making the electronic device, in detail.

Figure 1:
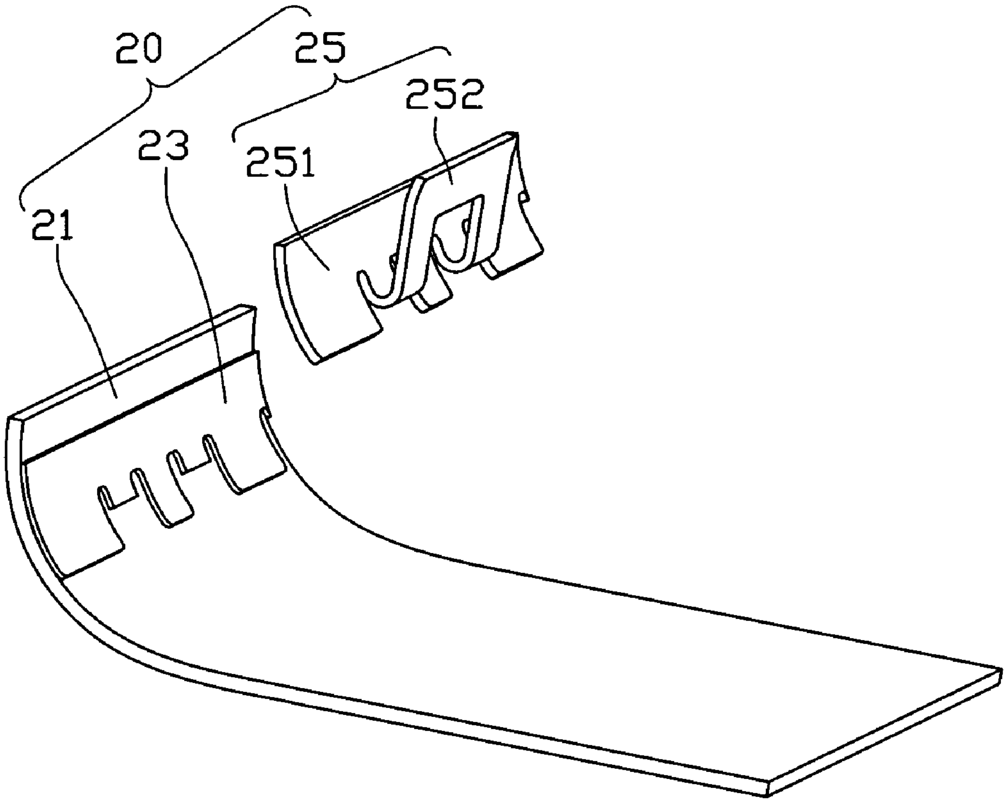
FIG. 1 is an exploded, isometric view of an electronic device having metallic connecting structures according to a first preferred embodiment of the present invention.
Figure 2:
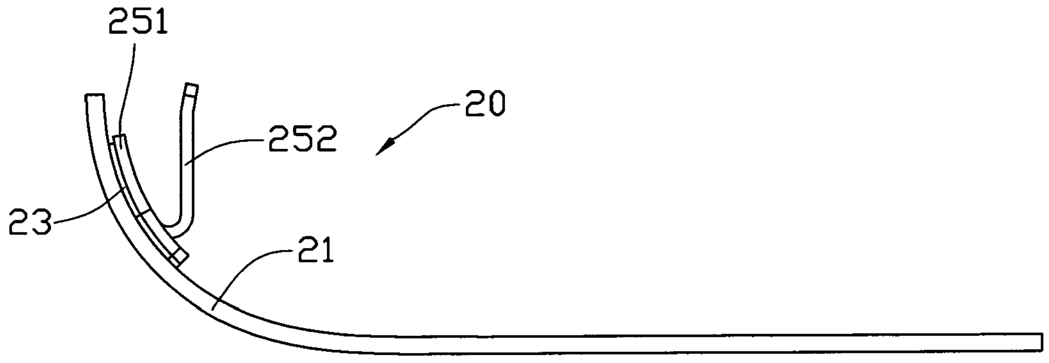
FIG. 2 is a side view of the electronic device having metallic connecting structures of FIG. 1.

Referring to FIGS. 1 and 2, a metallic connecting structure 20 of an electronic device (for example, an MP3 player) in accordance with the first preferred embodiment of the present invention is shown. The metallic connecting structure 20 includes a metallic housing 21, a bonding film 23, and a metallic clip 25. The metallic clip 25 is fixed to an inner surface of the metallic housing 21 via the bonding film 23. The metallic connecting structure 20 may be part of a housing assembly of the electronic device. In this embodiment, the metallic housing 21 is a curved sheet. The bonding film 23 is a thermoplastic adhesive bonding film. The metallic clip 25 includes a base 251 and a U-shaped elastic portion 252. The U-shaped elastic portion 252 has a pair of leg portions (not labeled) extending from the base 251 and bending up and outwards. A shape of the base 251 is similar to that of the bonding film 23 such that the base 251 can substantially adhere to the bonding film 23, thus improving the bonding strength between the metallic clip 25 and the metallic housing 21.

A method for making the metallic connecting structure 20 of the electronic device includes the following steps. A hot press machine (not shown) having a press head is employed.

The bonding film 23 is placed on the inner surface of the metallic housing 21. The hot press machine is turned on and the press head thereupon is heated to a first predetermined temperature of about 40° C. to about 50° C. After being heated to the first predetermined temperature, the press head is driven to press the bonding film 23 for about two minutes, thereby attaching the bonding film 23 onto the metallic housing 21. The metallic clip 25 is positioned tightly on the bonding film 23 of the metallic housing 21. The temperature of the press head is then raised to a second predetermined temperature of about 160° C. to about 170° C. After being heated to the second predetermined temperature, the press head is driven to press the metallic clip 25 to the metallic housing 21 for at least two minutes, thereby attaching the metallic clip 25 on the bonding film 23 of the metallic housing 21.

Figure 3:
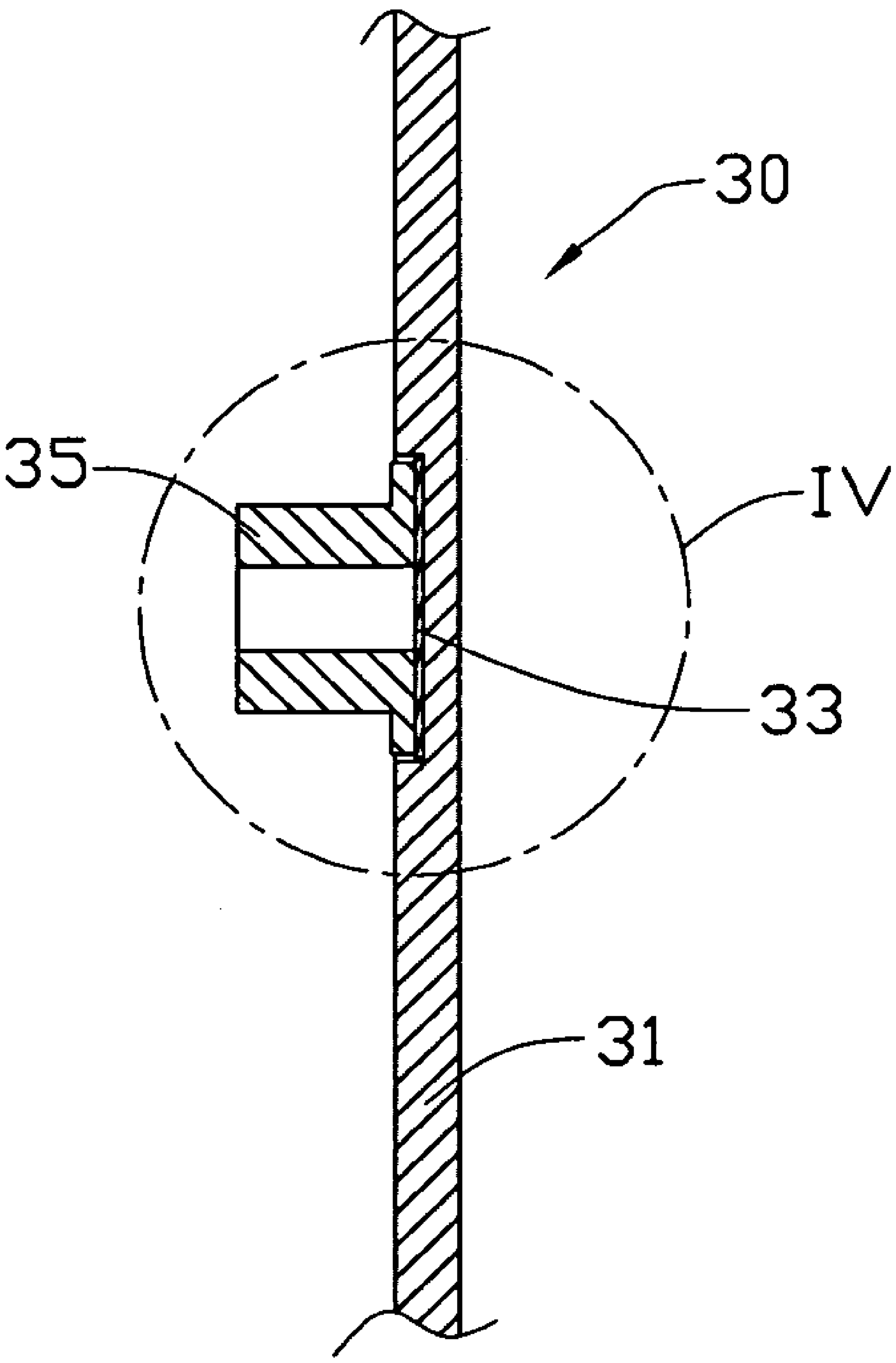
FIG. 3 is a cross-sectional view of part of an electronic device having metallic connecting structures according to a second preferred embodiment of the present invention.
Figure 4:
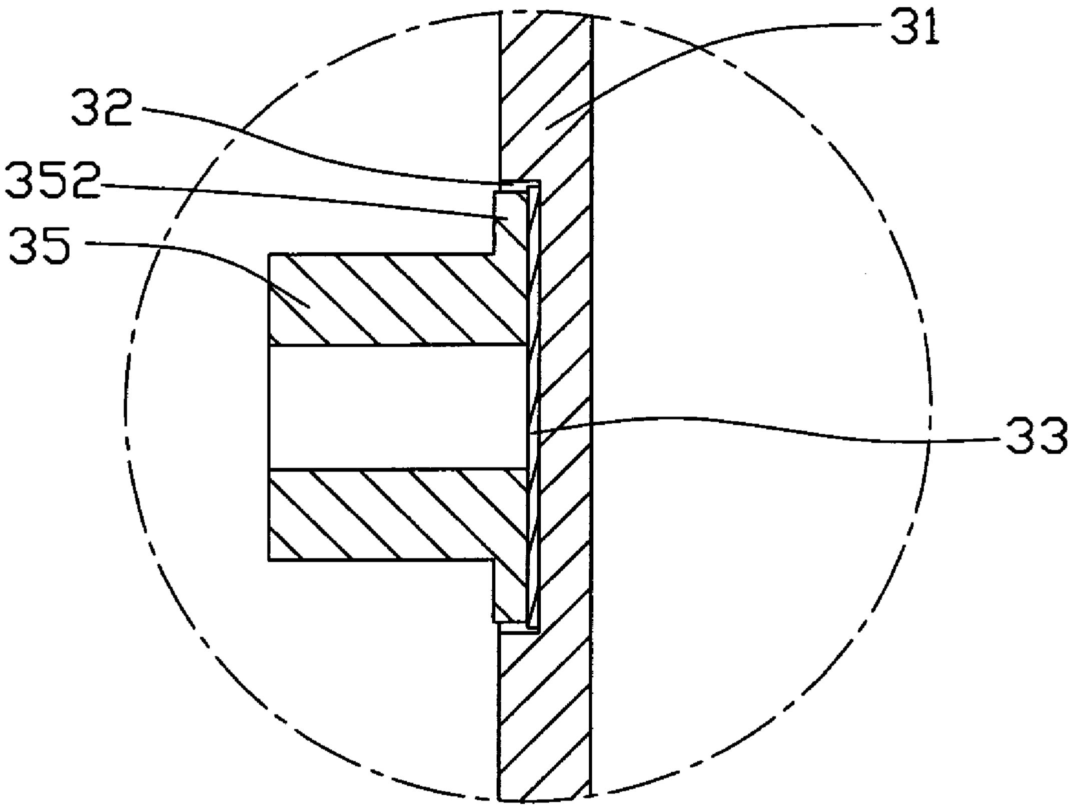
FIG. 4 is an enlarged view of a circled portion IV of FIG. 3.

Referring to FIGS. 3 and 4, a metallic connecting structure 30 of an electronic device in accordance with a second preferred embodiment of the present invention is shown. The metallic connecting structure 30 includes a metallic housing 31, a bonding film 33, and a metallic stud 35 with a base 352. In the second preferred embodiment, the bonding film 33 is a thermoplastic adhesive bonding film. The metallic housing 31 is substantially a flat sheet. A circular depression 32 is defined in an inner surface of the metallic housing 31. The size and shape of the circular depression 32 are configured to correspond to the size and shape of the base 352 of the metallic stud 35 so that the stud 35 can be received by the circular depression 32. The bonding film 33 adheres to a bottom surface of the circular depression 32 and the metallic stud 35 adheres to the bonding film 33 in the circular depression 32 correspondingly. Accordingly, the metallic stud 35 is fixed to an inner surface of the metallic housing 31 via the bonding film 33. It should be pointed out that it is better for the depth of the circular depression 32 to be greater than the thickness of the bonding film 33.

A method for making the metallic connecting structure 30 of the electronic device includes the following steps. A hot press machine (not shown) having a press head is employed. The bonding film 33 is placed on the bottom surface of the circular depression 32. The hot press machine is turned on and the press head thereupon is heated to a first predetermined temperature of about 40° C. to about 50° C. After the first predetermined temperature is reached, the press head is driven to press the bonding film 33 to the metallic housing 31 for about two minutes, thereby attaching the bonding film 33 on the metallic housing 31. The metallic stud 35 is positioned onto the bonding film 33 of the metallic housing 31 tightly. The temperature of the press head is then increased to a second predetermined temperature of about 160° C. to about 170° C. After being heated to the second predetermined temperature, the press head is driven to press the metallic stud 35 to the metallic housing 31 for at least two minutes, thereby attaching the metallic stud 35 on the corresponding bonding film 33 of the metallic housing 31.

It is to be understood that the circular depression 32 of the metallic housing 31 can have other shapes as long as the shape of the circular depression confirms to the shape of the base 352 of the stud 35. It should be pointed out that the circular depression 32 can be omitted. That is, the metallic stud 35 can be directly fixed to the inner surface of the metallic housing 31 via the bonding film 33 anywhere on the metallic housing 31.

The methods for making the metallic connecting structures 20, 30 of the electronic devices are simple and can decrease the manufacturing costs because of the use of the hot press machine instead of welding. In addition, when compared with welding methods, the first and second working temperatures of the methods for making the metallic connecting structures 20, 30 of the electronic devices are lower. Thus the electronic devices made by the methods are less likely to deform and/or change color easily due to heating with high temperatures.

In addition to the metallic clip 25 and the metallic stud 35, many other metallic elements can be fixed to the metallic housing 21, 31 via the bonding film 23, 33 by the hot press method.

Finally, while the present invention has been described with reference to particular embodiments, the description is illustrative of the invention and is not to be construed as limiting the invention. Therefore, various modifications can be made to the embodiments by those skilled in the art without departing from the true spirit and scope of the invention as defined by the appended claims.

What is claimed is:

1. A method for making an electronic device having a metallic housing, at least one bonding film and at least one metallic element, wherein the at least one metallic element is fixed to an inner surface of the metallic housing via the bonding film, comprising:

providing a hot press machine having a press head;

placing the at least one bonding film on the inner surface of the metallic housing;

heating the press head to a first predetermined temperature of about 40° C. to about 50° C.;

after the first predetermined temperature is reached, driving the press head to press the at least one bonding film to the metallic housing for a first predetermined time, thereby attaching the at least one bonding film on the metallic housing;

placing the at least one metallic element on the at least one bonding film of the metallic housing;

heating the press head to a second predetermined temperature of about 160° C. to about 170° C.;

after the second predetermined temperature is reached, driving the press head to press the at least one metallic element to the metallic housing for second predetermined time, thereby attaching the at least one metallic element on the bonding film.

2. The method of claim 1, wherein the at least one metallic element is a metallic clip.

3. The method of claim 2, wherein the metallic clip comprises a base and a U-shaped elastic portion, the U-shaped elastic portion having a pair of feet portions extending from the base and bending up and outwards.

4. The method of claim 1, wherein the at least one metallic element is a metallic stud.

5. The method of claim 4, wherein the metallic housing defines at least one depression, the at least one bonding film adheres to a bottom surface of the at least one depression, and the metallic stud adheres to the at least one bonding film in the at least one depression correspondingly.

6. The method of claim 5, wherein a depth of the at least one depression is greater than a thickness of the bonding film.

7. The method of claim 1, wherein the bonding film is a thermoplastic adhesive bonding film.

8. The method of claim 1, wherein the first predetermined time is about two minutes.

9. The method of claim 1, wherein the first predetermined time is in a range of at least two minutes.

* * * * *